United States Patent [19]

Maeng et al.

[11] Patent Number: 5,745,857
[45] Date of Patent: Apr. 28, 1998

[54] GAAS POWER AMPLIFIER FOR ANALOG/DIGITAL DUAL-MODE CELLULAR PHONES

[75] Inventors: Sung-Jae Maeng; Chang-Seok Lee; Hyung-Moo Park, all of Daejeon, Rep. of Korea

[73] Assignee: Electronics and Telecommunications Research Institute, Daejeon, Rep. of Korea

[21] Appl. No.: 562,370

[22] Filed: Nov. 22, 1995

[30] Foreign Application Priority Data

Dec. 21, 1994 [KR] Rep. of Korea ............... 94-35472

[51] Int. Cl.$^6$ .................................................. H04B 1/40
[52] U.S. Cl. .................... 455/553; 455/575; 455/127; 330/136; 330/310
[58] Field of Search ................. 455/89, 90, 91, 455/95, 110, 111, 113, 114, 119, 127, 550, 552, 553, 575; 330/129, 136, 302, 306, 310; 333/104, 246

[56] References Cited

U.S. PATENT DOCUMENTS

| 4,423,388 | 12/1983 | Crescenzi, Jr. et al. | 330/310 |
| 5,051,706 | 9/1991 | Zushi | 330/306 |
| 5,392,463 | 2/1995 | Yamada | 455/127 |
| 5,532,646 | 7/1996 | Aihara | 330/136 |

OTHER PUBLICATIONS

Cardinal et al; IEEE MTT-S Digest 1994; A New Adaptive Double Envelope Feedback (ADEF) Linearizer for Mobile Radio Power Amplifiers.

Takagi et al; IEEE 1992 Microwave and Millimeter-Wave Monolithic Circuits Symposium; A UHF Band 1.3W Monolithic Amplifier with Efficiency of 63%. pp. 35–38.

Ota et al; 1992 IEEE MTT-S Digest; Highly efficient, very compact GaAS power module for cellular telephone; pp. 1517–1520.

Maeda, et al; GaAs IC Symposium; A 3.5V, 1.3W GaAs Power Multi Chip for IC for Cellular Phones; pp. 53–56.

Yamamoto, et al; 3.3V, 1W GaAs One-Chip Power Amplifier MMIC for Cellular Phones; pp. 1061–1071.

Tateoka et al; 1994 IEEE MTT-S Digest; A GaAs MCM Power Amplifier of 3.6V Operation with High Efficiency of 49% for 0.9GHz Digital Cell Phone Systems.

Primary Examiner—Reinhard J. Eisenzopf
Assistant Examiner—Thanh Le
Attorney, Agent, or Firm—Jacobson, Price, Holman & Stern, PLLC

[57] ABSTRACT

An analog/digital dual-mode power amplifier which provides a good linearity and a high efficiency comprises a first and a second power field effect transistors, and an input stage, a middle stage and an output stage. An input stage receives the input signal through an input terminal. A middle stage applies a second gate bias voltage appropriately controlled in response to an analog operating mode or a digital operating mode to a second power FET. An output stage provides matching at center frequency and has the impedance of less than 2Ω for a second harmonic and a third harmonic. Accordingly, a good linearity and high efficiency circuit can be obtained.

5 Claims, 8 Drawing Sheets

GAAS POWER AMPLIFIER FOR ANALOG/DIGITAL DUAL-MODE CELLULAR PHONES

BACKGROUND OF THE INVENTION

1. Field of the Invention

The present invention relates to a power amplifier, more particularly to GaAs power amplifier for analog/digital dual-mode cellular phones which can be operated with a voltage of less than 3.3 volt.

2. Description of the Prior Art

In general, power amplifiers which are used in microwave apparatus, such as cellular phones, are an essential component for amplifying small signals to send high power through antennas.

As the users of the mobile radio communication network system are rapidly increased in these days, analog communication methods have not satisfied the users' demand sufficiently. Therefore, it is necessary to convert an analog communication method to a digital communication method to fully satisfy the demand of the increased users.

However, an analog/digital dual-mode should not be used for the time being until a full exchange from the analog communication method to the digital communication method is accomplished.

A power amplifier in the analog communication method requires high output power and high efficiency, while a power amplifier in the digital communication method requires much more output control capacity than a power amplifier in the analog communication method, and also requires low intermodulation distortion.

Recently, a cellular phone device having a battery of less than 3.3 volt has been developed so as to realize minaturization of the device.

In order to satisfy the digital requirements in a conventional power amplifier, which has been designed using an analog method, it is necessary to overcome the disadvantages that output power is weak and is not efficient because a low output power of less than 1 dB compression point to 5 dB compression point is used. Therefore it is necessary to develop a power amplifier which simultaneously satisfies the requirements of linearity and efficiency.

The prior art for obtaining linearity using the construction of a circuit is described in IEEE MTT-S digest, pp. 593–576, 1994, entitled "A NEW ADAPTIVE DOUBLE ENVELOP FEED BACK LINEARIZER FOR MOBILE RADIO POWER AMPLIFIERS".

FIG. 1 is a circuit showing an example of a power amplifier with a linearizer. This circuit includes class AB power amplifier 1, a linearizer comprising a voltage controllable phase shifter 2 and a gate bias controller 3.

Referring to FIG. 1, voltage controllable phase shifter 2 includes: coupler 21, phase shifter 22, isolator 23, base band frequency compensation filter 24, operational amplifier 25, diodes 26a and 26b, 90° hybrid 27, and a power divider 28. A gate bias controller 3 includes an RF low pass filter 31, a coupler 32, a base-band frequency compensation filter 33, and an attenuator 37.

As described above, the amplifier using the linearizer reduces the intermodulation distortion, while it has disadvantages that the modulation bandwidth is limited by the operational amplifier and frequency compensation filter.

IEEE MTT-S digest [K. Tateoka, et al., "A GaAs POWER AMPLIFIER OF 3.6V OPERATION WITH HIGH EFFICIENCY OF 49% FOR 0.9 GHz DIGITAL CELLULAR PHONE SYSTEMS"] discloses a design method for the output stage of an FET in a minimum distortion position by respectively measuring the distortion of QPSK signal, phase shift, the 5th-order intermodulation distortion using load-pull measurements (see FIG. 2).

According to the design method, an optimum design can be achieved. However, the measurement process is troublesome and it not only takes many times to measure them but also requires much greater design costs.

SUMMARY OF THE INVENTION

The present invention has been made in order to solve the disadvantages as stated above, and has for its object to provide a GaAs power amplifier for analog/digital dual-mode cellular phones.

According to the invention, there is provided an analog/digital dual-mode power amplifier, which comprises: a first and a second power Field Effect Transistor (FET) for amplifying an input signal; an input stage, receiving said input signal through an input terminal, applying a first gate bias voltage appropriately controlled in response to an analog operating mode or a digital operating mode to said first power FET so as to directly vary a gate bias voltage in response to input voltage, a middle stage, applying a first drain bias voltage to said first power FET, applying a second gate bias voltage appropriately controlled in response to an analog operating mode or a digital operating mode to said second power FET so as to directly vary a gate bias voltage in response to output power; and an -output stage, applying a second drain bias voltage to said second power FET, providing a matching network for a center frequency and having the impedance of less than 2Ω for a second and a third harmonic frequency and outputting the amplifying signal through an output terminal.

For the construction of a power amplifier according to the present invention, the output power characteristics of two stage amplifier may be measured by using double L-section tuning circuits which includes a pair of power FETs 10 and 20, microstrips having characteristic impedance of 50Ω, and variable capacitors. To obtain the optimum impedance, the tuning circuits are adjusted to have the maximum power. The optimum impedances are determined by measuring the tuning circuits using a network analyzer in a frequency band of 824 to 849 MHz. The optimum impedances are respectively matched to the input stage 30, the middle stage 40 and the output stage 50, using a microwave simulator.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
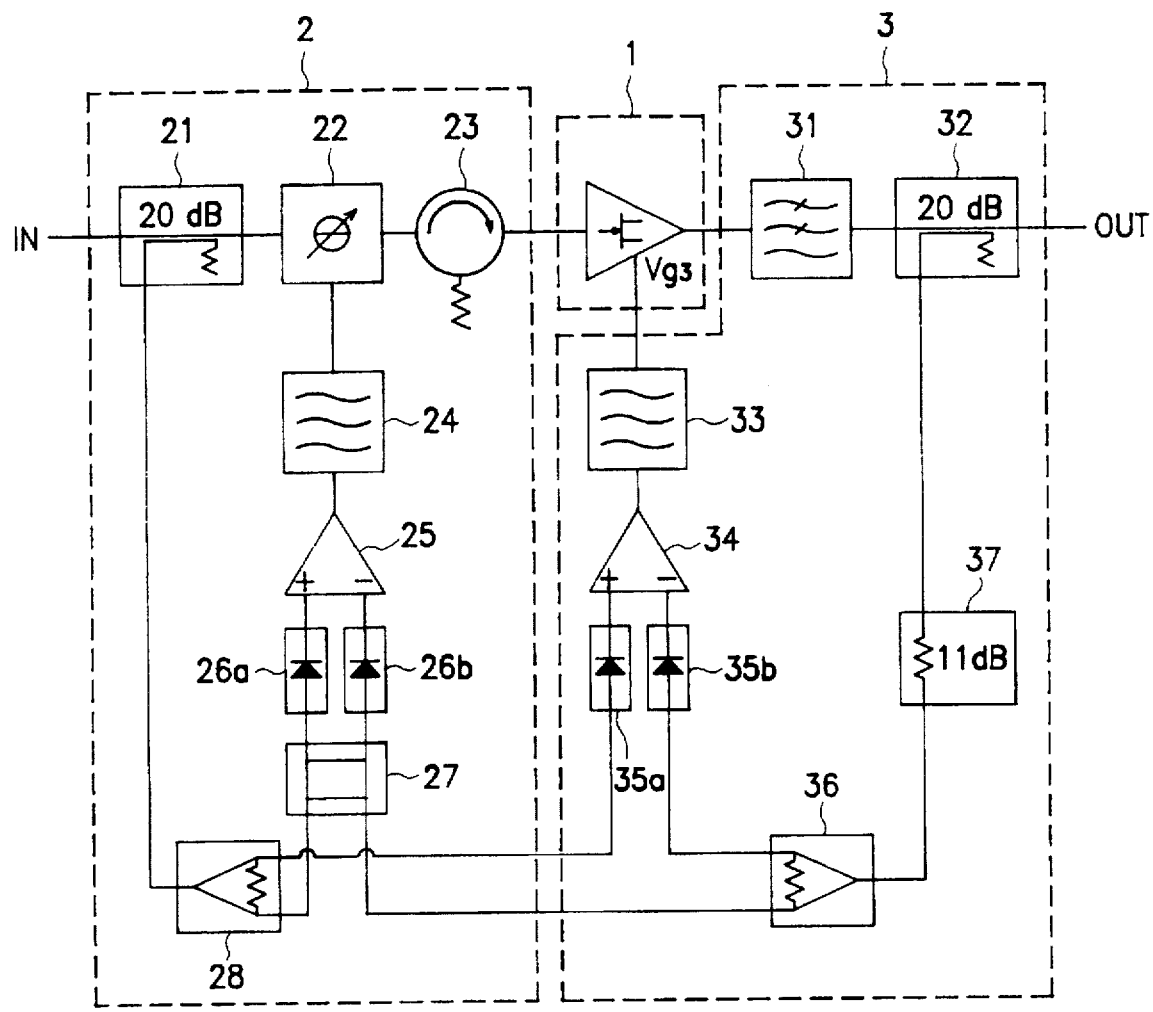
FIG. 1 is a circuit diagram showing a conventional power amplifier with linearizer.
Figure 2:
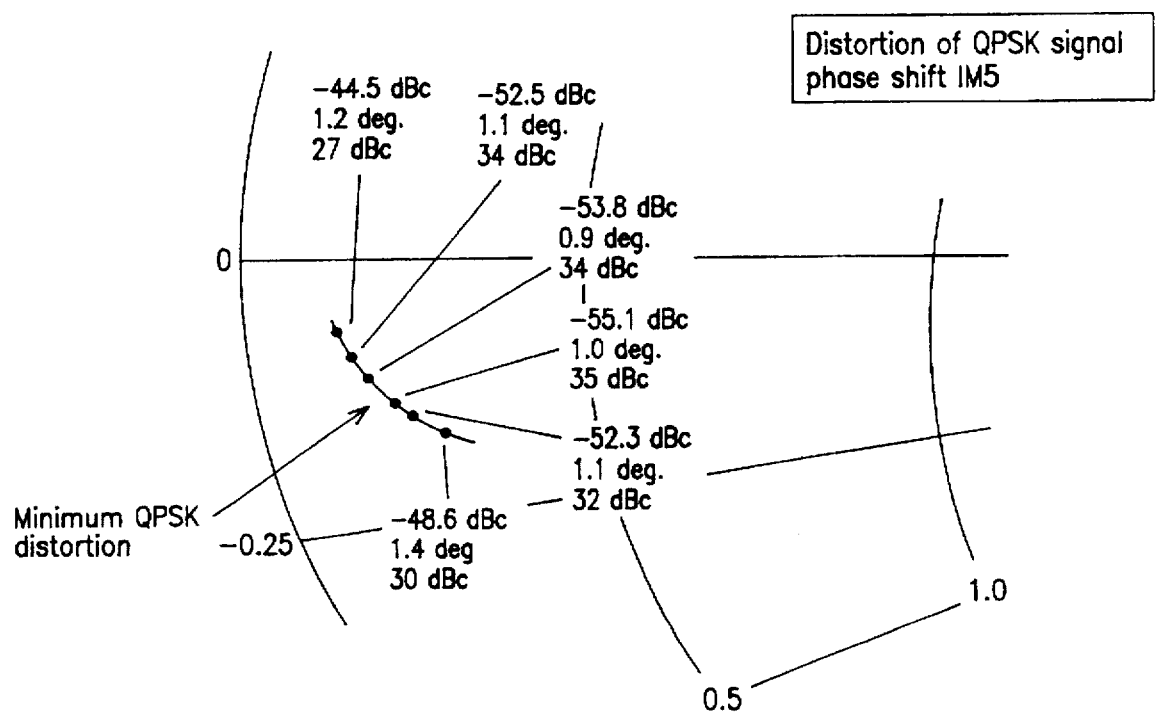
FIG. 2 is a diagram usable for explaining a design method for a digital power amplifier in accordance with the prior art.
Figure 3:
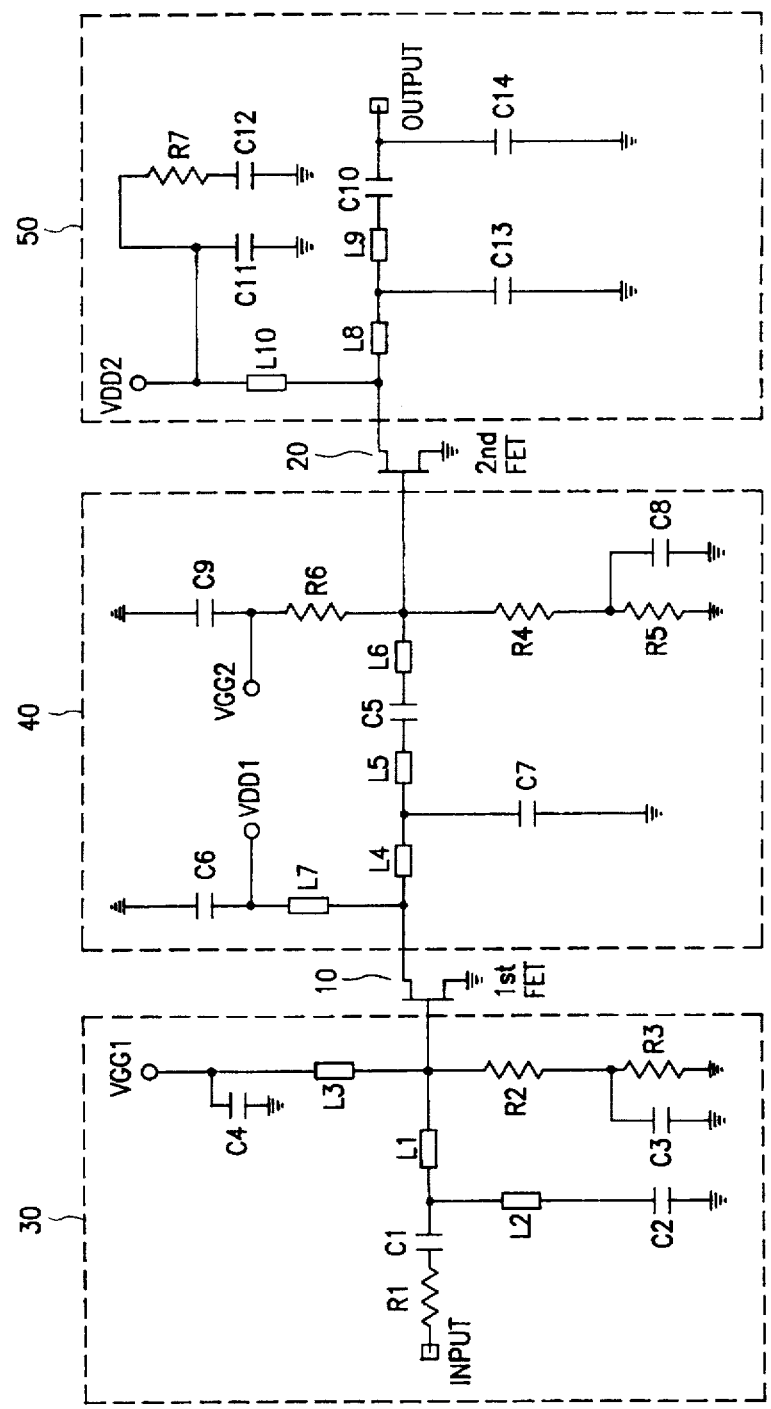
FIG. 3 is a circuit diagram of a GaAs power amplifier for analog/digital dual-mode cellular phones in accordance with the present invention.

FIG. 3 is a circuit diagram illustrating the construction of a GaAs power amplifier in accordance with the present invention. As shown in FIG. 3, reference numerals 10 and 20 respectively denote a first power FET and a second power FET, reference numerals 30, 40, and 50 respectively denote the input stage, the middle stage, and the output stage of the power amplifier. And also, reference numerals R1 to R7 respectively denote resistors, reference numerals L1 to L10 respectively denote microstrips, and reference numerals C1 to C14 respectively denote capacitors.

The input stage 30 of the amplifier is constructed as follows. An input terminal is serially connected to the gate of first power FET 10 through a resistor R1, a capacitor C1 and a microstrip L1. A microstrip L2 is connected between the capacitor C1 and the microstrip L1 to a capacitor C2, which in turn is serially connected to ground. A resistor R2 is connected to the other side of microstrip L1. A resistor R3 is serially connected between resistor R2 and ground. A compacitor C3 is connected to ground in parallel to the resistor R3, but is serially connected to the resistor R2. A microstrip L3 is connected between the gate of first power FET 10 and a first gate bias voltage source VGG1. A capacitor C4 is connected in parallel to microstrip L3 to a ground terminal.

Herein, the resistors R1 and R2 are stabilizing resistors, the capacitor C1 is a DC blocking capacitor, and the capacitors C3 and C4 are RF bypass capacitors.

To match to the source impedance of the first FET 10, microstrips L1, L2 and L3 have a line width of 200 μm. To obtain the linearity and efficiency of an amplifier, the gate bias voltage (VGG1) source of the first power FET 10 is controlled by voltage from a predetermined voltage source (not shown) according to the operating mode (that is, analog mode or digital mode).

The middle stage 40 of the amplifier is constructed as follows. Microstrips L4, L5 and L6 are serially connected between the drain of the first power FET 10 and the gate of second power FET 20. A capacitor C5 is connected between the microstrip L5 and the microstrip L6. A microstrip L7 is connected between the drain of the first power FET 10 and a bias voltage source VDD1 for the drain, the source of FET 10 being connected to ground. A capacitor C6 is connected between the bias voltage source VDD1 of the first drain and a ground terminal. One terminal of a capacitor C7 is connected between the microstrip L4 and the microstrip L5, and the other terminal of capacitor C7 is connected to a ground terminal. A resistor R4 is connected in parallel between the gate of the second power FET 20 and the microstrip L6. A resistor R5 is connected between the resistor R4 and a ground terminal. A capacitor C8 is connected in parallel to resistor R5 and to ground. A resistor R6 is connected between the gate of the second power FET 20 and the second gate bias voltage VGG2. A capacitor C9 is connected between the second gate bias voltage source VGG2 and a ground terminal.

Figure 8:
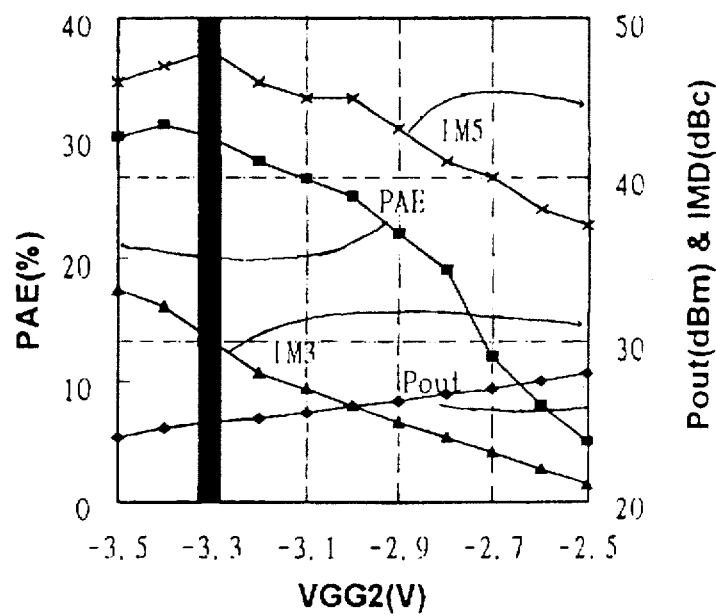
FIG. 8A is a diagram showing a gate bias control embodiment in the case of a digital mode of the present invention.
FIG. 8B is a diagram showing a gate bias control embodiment in the case of an analog mode of the present invention.
Figure 8:
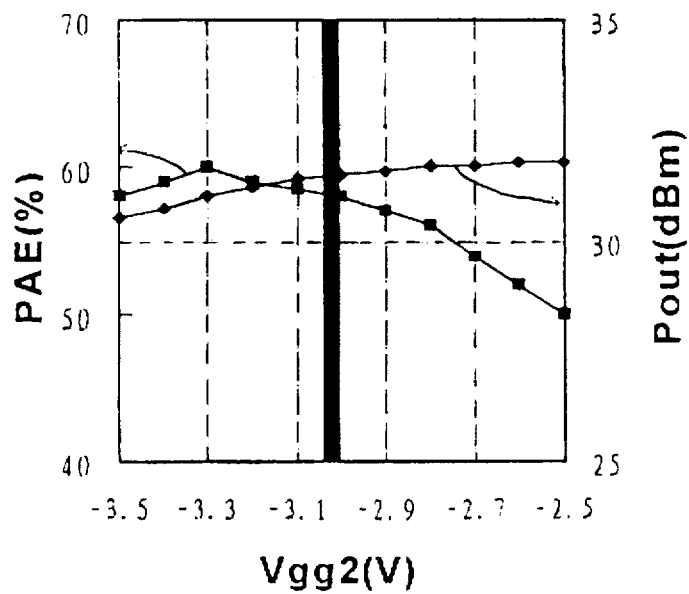

The resistor R4 is a stabilizing resistor. The resistors R6 and R5 are gate bias voltage dividing resistors. The capacitor C5 is a DC blocking capacitor and the capacitors C6, C8 and C9 are RF bypass capacitors. To match the load impedance of the first power FET 10 and the source impedance of the second power FET 20, the microstrips L4, L5, L6 and L7 having a line width of 200 μm are connected to the capacitor C7 in parallel. Herein, the first drain bias voltage VDD1 is 3.3 volts. To obtain the linearity and efficiency of an amplifier, the gate bias voltage VGG2 of the second FET 20 is controlled by predetermined voltages as shown in FIG. 8 according to a circuit operating mode (that is, analog mode or digital mode).

The output stage 50 of the amplifier is constructed as follows. Microstrips L8 and L9 are serially connected between the drain of the second power FET 20 and the output terminal of the amplifier. A capacitor C10 is connected between the microstrip L9 and the output terminal. A microstrip L10 is connected between the drain of the second power FET 20 and a second drain has voltage source VDD2. A capacitor C11 is connected between the second drain bias voltage source VDD2 and a ground terminal. A resistor R7 is connected to the second drain voltage source VDD2 and connected to a capacitor 11 in parallel. A capacitor C12 is connected between the resistor R7 and a ground terminal. One terminal of a capacitor C13 is connected between microstrips L8 and L9 and its other terminal is connected to a ground terminal. A capacitor 14 is connected between the output stage of the amplifier and a ground terminal.

Figure 4:
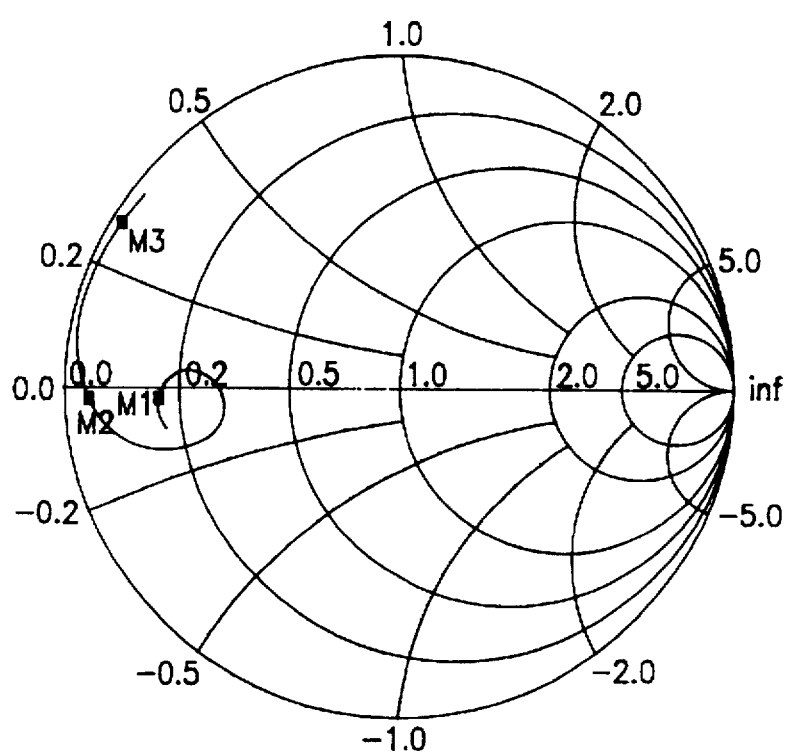
FIG. 4 is a diagram explaining an impedance characteristic in response to a frequency of an output stage in a power amplifier as shown in FIG. 3.

The second drain bias voltage VDD2 is about 3.3 volt. The capacitor C11 coupled to the resistor R7 is a stabilization circuit. A capacitor C10 is a DC blocking capacitor and a capacitor C12 is an RF bypass capacitor. The output stage 50 is designed to be matched at center frequency of 836.5 KHz by using the microstrips L8 and L9 and the capacitor C13 and C14, and to have a low impedance of less than 2Ω at a second harmonic frequency (M2: 1670 MHz) and a third harmonic frequency (M3: 2510 MHz) as shown in FIG. 4.

In accordance with one embodiment as stated above in the input stage 20, it is preferable to have the resistor R1 of 10 Ω, the resistor R2 of 160 Ω, the capacitor C1 of 47 pF, the capacitor C2 of 3 pF, the capacitor C3 of 1000 pF, and the capacitor C4 of 1000 pF. Also, microstrips L1, L2 and L3 are preferable to have a line width of 200 μm and respectively line lengths of 12,500 μm, 6,500 μm, 28,000 μm.

In the middle stage 40, it is preferable to have the resistor R4 of 100 Ω, the capacitor C5 of 47 pF, the capacitor C6 of 1,000 pF, the capacitor C7 of 11 pF, the capacitor C8 of 1,000 pF, and the capacitor C9 of 1,000 pF. Also microstrips L4, L5, L6 and L7 are preferable to have a line width of 200 μm and respectively line lengths of 3,500 μm, 1,500 μm, 6,000 μm and 23,000 μm.

In output stage 50, it is preferable to have the capacitor of 8 to 10 pF, the capacitor of 4 to 6 pF. Also, microstrips L8 and L9 are preferable to respectively have 300 μm line width and the line length of less than 1,500 μm and 5,000 μm. Because the length of the microstrips L8 and L9 are less than 1,500 μm and 5,000 μm, the amplifier has features which are matched in main frequency (836.5 MHz) and has a small incidence for a second higher harmonic (1,670 MHz) and a third higher harmonic (2,510 MHz).

In the input stage 30 and the middle stage 40 of this embodiment, microstrips are utilized having a line width of 200 μm, a chip resistance of 1,005(1×0.5 mm) and a chip capacitance so as to lessen the size of circuit. Also it is required to employ microstrips having a line width of 300 μm so as to lessen the loss of power. Further, it is required to employ FR4 substrate as PCB.

Figure 5:
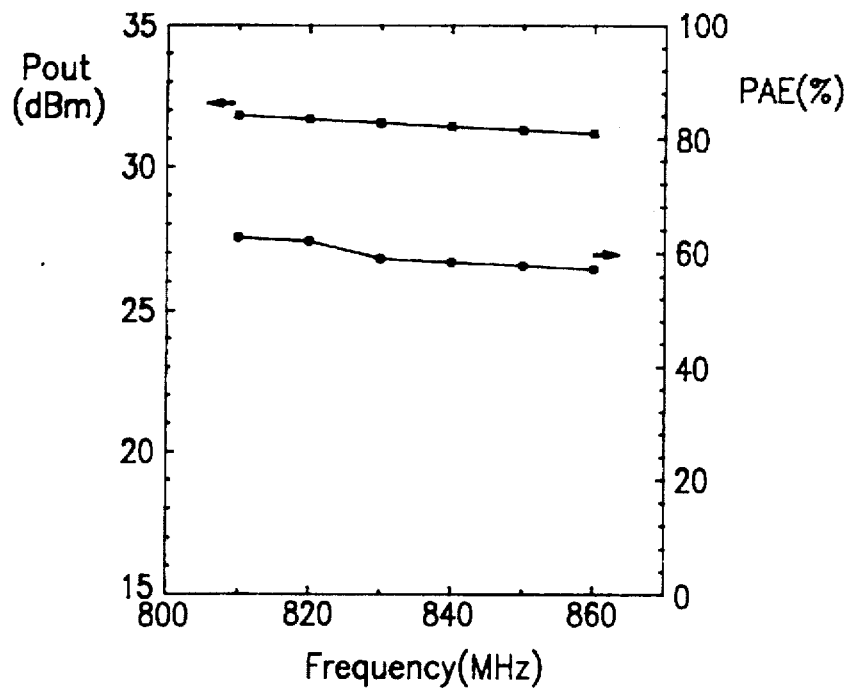
FIG. 5 is a diagram explaining the characteristic of output power and power added efficiency in response to the frequencies of the power amplifier as shown in FIG. 3.

As shown in FIG. 5, it is noted that output powers and PAE's can be provided in case of analog mode. Herein, if an applied voltage is 3.3 volt, input power 7 dBm and a frequency band is 824 to 949 MHz, the output power of 31.5 dBm±0.5 dBm and power additional efficiency of 58%±1% can be obtained.

Figure 6:
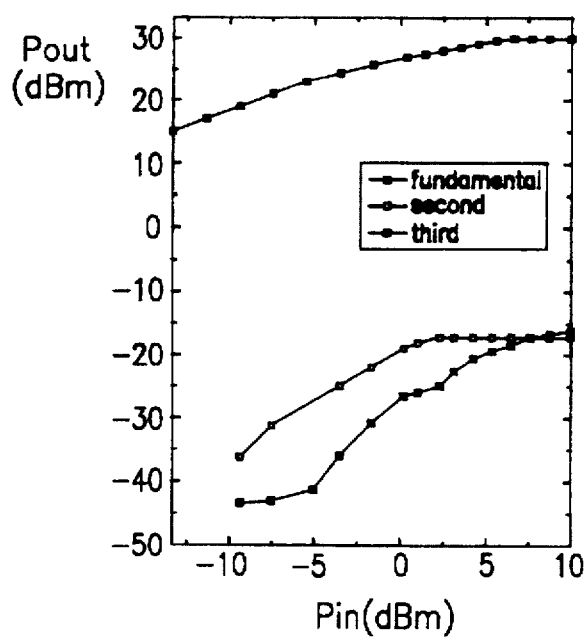
FIG. 6 is a diagram showing the characteristic of output power and power added efficiency in response to the input power of the power amplifier as shown in FIG. 3.

As shown in FIG. 6, provided the following condition (that is, an applied voltage of 3.3 volt, and center frequency of 836.5 MHz and an output power of 31.5 dBm, a second harmonic of −50 dBc and a third harmonic of −51 dBc can be obtained. As a result, it is noted that the power amplifier according to the preferred embodiment has harmonic characteristics lower than those of the prior art.

Figure 7:
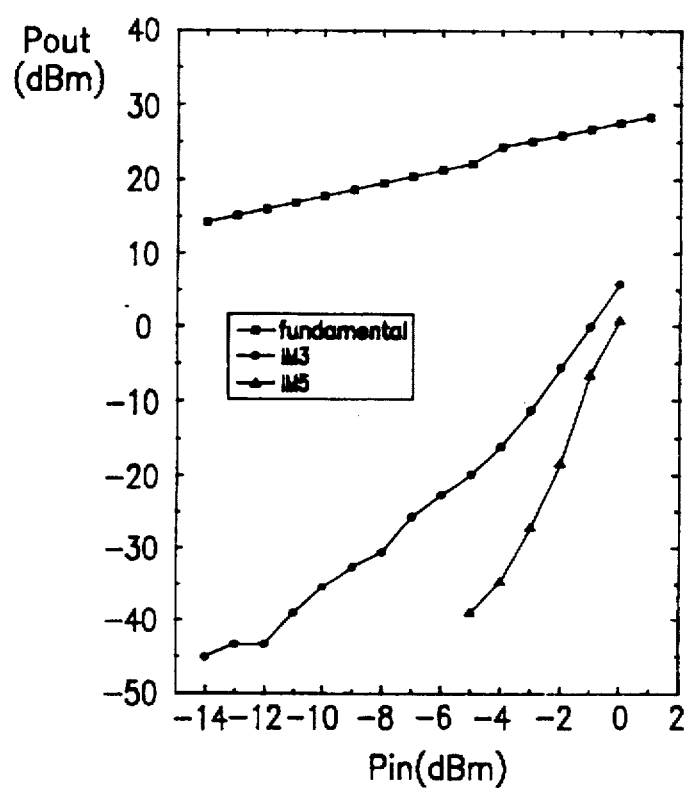
FIG. 7 is a diagram showing the characteristic of fundamental output powers, 3rd-order intermodulation distortions and 5th-order intermodulation distortions in response to input powers of the power amplifier shown in FIG. 3.

As shown in FIG. 7, the power amplifier according to the present invention has respectively a 3rd-order intermodulation distortion (IM3) of −32 dBc and a 5th-order intermodulation distortion (IM5) of −45 dBc in a case where output power of a center frequency is 26 dBm. As a result, it is noted that the power amplifier according to the present invention can be employed in a digital communication system such as CDMA.

As shown in FIG. 8A, provided the following condition (that is, an input power of −2 dBm and a second gate bias voltage of −3.3 volt), a digital mode operating characteristic corresponding to the output power of 26 dBm, an efficiency of 30%, an IM3 of −30 dBc and an IM5 of −48 dBc can be obtained.

As shown in FIG. 8B, provided the following condition (that is, an input power of 7 dBm and a second gate bias voltage of −3.0 volt), an analog mode operating characteristic corresponding to the output power of 31.5 dBm, and an efficiency of 58% can be obtained.

Figure 9:
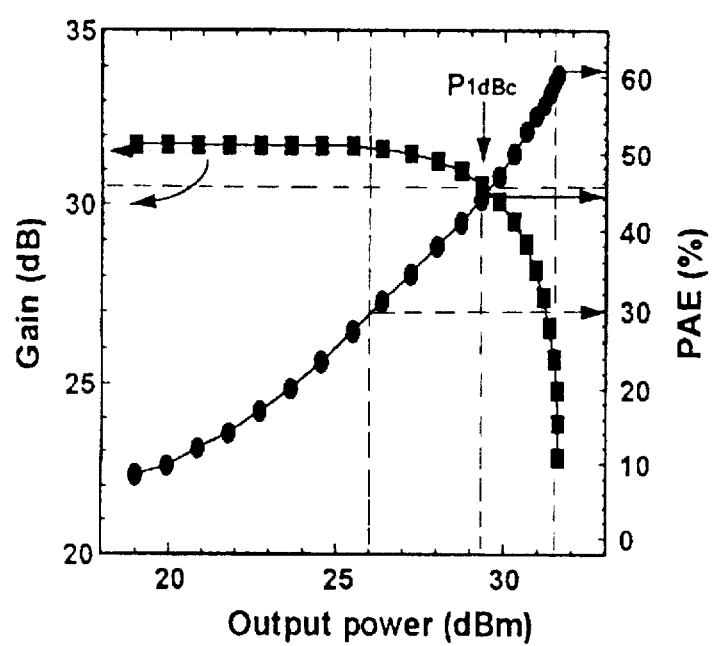
FIG. 9 is a diagram showing gains and efficiencies (PAE) corresponding to output powers for both an analog operating and digital operating mode of the present invention.

As shown in FIG. 9, a small signal gain maintains 31.5 dB ±0.4 dB in output power less than 26 dBm. Herein, a PAE in an analog mode reaches 58% at 31.5 dBm but a PAE in a digital mode reaches 30% at 26 dBm.

As explained above, the present invention provides a power amplifier by which analog/digital dual-mode cellular phones can be operated with a low voltage of less than 3.3 volts and a high linearity and a high efficiency can be achieved. And also, the manufacturing cost is economical owing to using cheap substrates such as an FR4 substrate.

What is claimed is:

1. Analog/Digital dual-mode power amplifier comprising:
    a first and a second power Field Effect Transistor (FET) for amplifying an input signal;
    an input stage having means for receiving said input signal through an input terminal and means for applying a first gate bias voltage, appropriately controlled in response to an analog operating mode or a digital operating mode, to said first power FET so as to directly vary a second gate bias voltage;
    a middle stage having means for applying a first drain bias voltage to said first power FET, means for applying a second gate bias voltage, appropriately controlled in response to an analog operating mode or a digital operating mode, to said second power FET so as to directly vary the gate bias voltage; and
    an output stage having means for applying a second drain bias voltage to said second power FET, means for matching the impedance of said second power FET at a center frequency and having the impedance of less than 2 Ω for a second harmonic frequency and a third harmonic frequency and means for outputting the amplified input signal through an output terminal.

2. An analog/digital dual-mode power amplifier in accordance with claim 1, wherein said output stage comprises:
    first and second microstrips and a first capacitor connected between the drain of said second power FET and said output terminal;
    a further microstrip connected between the drain of said second power FET and the second drain bias voltage source means;
    a second capacitor connectable between said second drain bias voltage source means and ground;
    a resistor coupled to said second capacitor and connected said second drain bias voltage source means;
    a third capacitor connectable between said resistor and ground;
    a fourth capacitor connected between said first and second microstrips and also connectable to ground;
    a fifth capacitor connected to said output terminal and connectable to ground.

3. An analog/digital dual-mode power amplifier in accordance with claim 2, wherein said third and fourth capacitors respectively have a capacitance of 8 to 10 pF and 4 to 6 pF, said first and second microstrips have a line width of 300 μm and a line lengths respectively of less than 1,500 μm and 5,000 μm.

4. An analog/digital dual-mode power amplifier in accordance with claim 3, wherein said applied second drain bias voltage is less than 3.3 volts.

5. An analog/digital dual-mode power amplifier in accordance with claim 1, wherein said input stage and said middle stage have microstrips that have respectively microstrip line widths of 200 μm, and said output stage has a microstrip with a line width of 300 μm.

* * * * *